United States Patent
Li et al.

(10) Patent No.: US 10,199,463 B2
(45) Date of Patent: Feb. 5, 2019

(54) NANOWIRE-BASED VERTICAL MEMORY CELL ARRAY HAVING A METAL LAYER INTERPOSED BETWEEN A COMMON BACK PLATE AND THE NANOWIRES

(71) Applicant: GLOBALFOUNDRIES INC., Grand Cayman (KY)

(72) Inventors: Waikin Li, Flushing, NC (US); Chengwen Pei, Danbury, CT (US); Ping-Chuan Wang, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/906,355

(22) Filed: Feb. 27, 2018

(65) Prior Publication Data

US 2018/0190770 A1 Jul. 5, 2018

Related U.S. Application Data

(62) Division of application No. 15/078,112, filed on Mar. 23, 2016, now Pat. No. 9,966,431.

(51) Int. Cl.
*H01L 29/06* (2006.01)
*H01L 29/423* (2006.01)
(Continued)

(52) U.S. Cl.
CPC .......... *H01L 29/0676* (2013.01); *B82Y 10/00* (2013.01); *H01L 23/5226* (2013.01);
(Continued)

(58) Field of Classification Search
CPC .............. H01L 29/0676; H01L 29/0665; H01L 29/0669; H01L 29/775; H01L 29/66439;
(Continued)

(56) References Cited

U.S. PATENT DOCUMENTS 5,001,526 A * 3/1991 Gotou ............... H01L 27/10841
257/302
7,241,655 B2 * 7/2007 Tang ................. H01L 27/10876
257/E21.411
(Continued)

FOREIGN PATENT DOCUMENTS

| DE | 10359889 | 7/2005 |
| DE | 102004023301 | 12/2015 |
| JP | 2006526860 | 11/2006 |

OTHER PUBLICATIONS

Picraux et al., "Silicon and Germanium Nanowires: Growth, Properties, and Integration", Apr. 2010, 9 pages, JOM, vol. 62, No. 44.

*Primary Examiner* — Marc Anthony Armand
*Assistant Examiner* — Younes Boulghassoul
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to vertical memory cell structures and methods of manufacture. The vertical memory cell includes a vertical nanowire capacitor and vertical pass gate transistor. The vertical nanowire capacitor composes of: a plurality of vertical nanowires extending from an insulator layer; a dielectric material on vertical sidewalls of the plurality of vertical nanowires; doped material provided between the plurality of vertical nanowire; the pass gate transistor composes of: high-k dielectric on top part of the nanowire, metal layer surrounding high-k material as all-around gate. And there is dielectric layer in between vertical nanowire capacitor and vertical nanowire transistor as insulator. At least one bitline extending on a top of the plurality of vertical nanowires and in electrical contact therewith; and at least one wordline formed on vertical sidewalls of the (Continued)

plurality of vertical nanowires and separated therefrom by the dielectric material.

5 Claims, 8 Drawing Sheets

(51) Int. Cl.
  *H01L 27/108* (2006.01)
  *H01L 23/522* (2006.01)
  *B82Y 10/00* (2011.01)
  *H01L 29/40* (2006.01)
  *H01L 29/66* (2006.01)
  *H01L 29/775* (2006.01)
  *H01L 49/02* (2006.01)

(52) U.S. Cl.
  CPC ........ *H01L 27/10805* (2013.01); *H01L 28/00* (2013.01); *H01L 29/401* (2013.01); *H01L 29/42392* (2013.01); *H01L 29/66439* (2013.01); *H01L 29/775* (2013.01)

(58) Field of Classification Search
  CPC ......... H01L 29/66496; H01L 29/42392; H01L 29/78642; H01L 27/10805–27/10891; H01L 27/1082; H01L 27/2454; H01L 27/0629; H01L 21/823487; H01L 21/823885; H01L 21/02603; H01L 29/7827–29/7828; H01L 29/66666; H01L 29/66469; H01L 29/1037
  See application file for complete search history.

(56) References Cited

U.S. PATENT DOCUMENTS

| | | |
|---|---|---|
| 7,335,259 B2 | 2/2008 | Hanrath et al. |
| 7,449,382 B2 | 11/2008 | Chen et al. |
| 8,049,203 B2 | 11/2011 | Samuelson et al. |
| 9,627,478 B1 * | 4/2017 | Leobandung ....... H01L 29/0676 |
| 2007/0111493 A1 | 5/2007 | Lee et al. |
| 2010/0012921 A1 | 1/2010 | Kawashima et al. |
| 2016/0315138 A1 | 10/2016 | Li et al. |

* cited by examiner

NANOWIRE-BASED VERTICAL MEMORY CELL ARRAY HAVING A METAL LAYER INTERPOSED BETWEEN A COMMON BACK PLATE AND THE NANOWIRES

FIELD OF THE INVENTION

The present disclosure relates to semiconductor structures and, more particularly, to vertical memory cell structures and methods of manufacture.

BACKGROUND

An increase in memory density results in inexpensive, high capacity storage. By 2020, it is expected that a memory device can store a trillion bits of information in an area the size of a postage stamp. However, increasing the density in memory is becoming ever more complex and expensive. And, with current conventional technologies the increment increase in memory density is slowing due to the difficulty of scaling, perhaps not even keeping pace with Moore's law.

SUMMARY

In an aspect of the disclosure, a vertical memory cell array includes: a plurality of vertical nanowires extending from an insulator layer; a dielectric material on vertical sidewalls of the plurality of vertical nanowires; doped material provided between the plurality of vertical nanowire; at least one bitline extending on a top of the plurality of vertical nanowires and in electrical contact therewith; and at least one wordline formed on vertical sidewalls of the plurality of vertical nanowires and separated therefrom by the dielectric material.

In an aspect of the disclosure, a vertical memory cell array includes: a plurality of vertical nanowires; a high-k dielectric material on vertical sidewalls of the plurality of vertical nanowires; doped polysilicon material provided between the plurality of vertical nanowire; at least one wordline formed on vertical sidewalls of the plurality of vertical nanowires over the high-k dielectric material and electrically isolated from the doped polysilicon material; and at least one bitline extending on a top of the plurality of vertical nanowires, in electrical contact with the plurality of vertical nanowires and electrically isolated from the doped polysilicon material.

In an aspect of the disclosure, a method of forming vertical memory cell array includes: growing a plurality of vertical nanowires extending from an insulator layer; depositing a dielectric material on vertical sidewalls of the plurality of vertical nanowires; depositing doped polysilicon material between the plurality of vertical nanowire; forming at least one wordline formed on the vertical sidewalls of the plurality of vertical nanowires and separated therefrom by the dielectric material; isolating the at least one wordline from the doped polysilicon material; and forming at least one bitline on a top of the plurality of vertical nanowires and in electrical contact therewith.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to vertical memory cell structures and methods of manufacture. More specifically, the present disclosure relates to high density vertical memory cell structures and methods of manufacture. In embodiments, the high density vertical memory cell structures utilize nanotechnologies, e.g., nanowire capacitors, to improve device density. In embodiments, memory density can be about 2-3× of current deep trench technology.

The high density vertical memory cell structures of the present disclosure can be manufactured in a number of ways using a number of different tools. In general, though, the methodologies and tools are used to form structures with dimensions in the micrometer and nanometer scale. The methodologies, i.e., technologies, employed to manufacture the high density vertical memory cell structures of the present disclosure have been adopted from integrated circuit (IC) technology. For example, the structures are built on wafers and are realized in films of material patterned by photolithographic processes on the top of a wafer. In particular, the fabrication of the high density vertical memory cell structures uses three basic building blocks: (i) deposition of thin films of material on a substrate, (ii) applying a patterned mask on top of the films by photolithographic imaging, and (iii) etching the films selectively to the mask.

Figure 1:
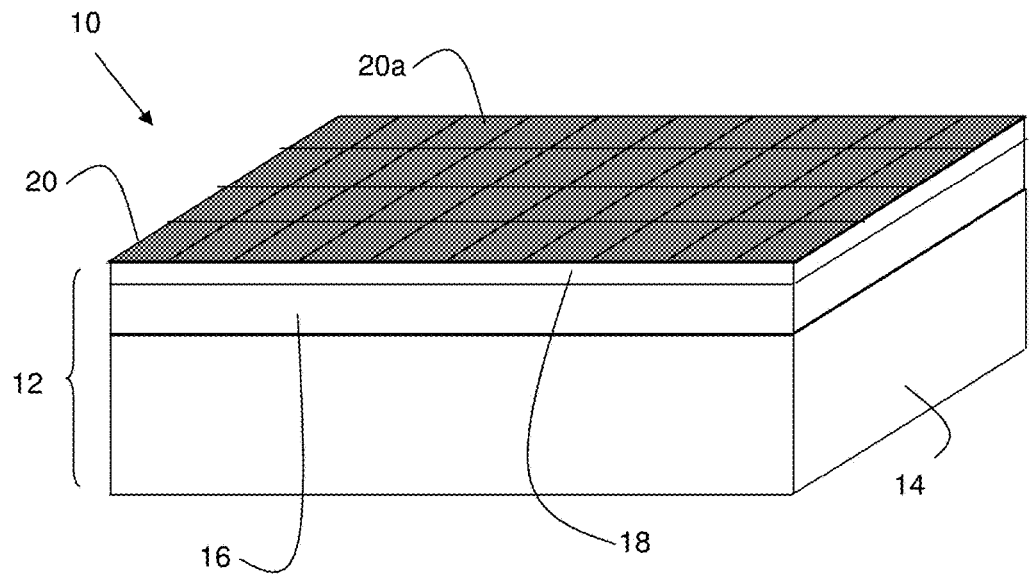
FIG. 1 shows a structure and respective fabrication processes in accordance with aspects of the present disclosure.

FIG. 1 shows a structure and respective processing steps in accordance with aspects of the present disclosure. In particular, the structure 10 of FIG. 1 includes a substrate 12. In embodiments, the substrate 12 can be a silicon-on-insulator (SOI) wafer; although other substrates 12 such as a BULK substrate are contemplated by the present disclosure. In embodiments, the substrate 12 includes an insulator layer 16 formed on aSi handler wafer 14. The insulator layer 16 can be, e.g., $SiO_2$; although other insulator materials are contemplated herein. The insulator layer 16 can have a thickness of about 15 nm to about 0.5 microns; although such dimensions are not critical for an understanding of the present disclosure.

Still referring to FIG. 1, a semiconductor layer 18 is formed on the insulator layer 16. The semiconductor layer 18 can be Si, for example. The present disclosure also contemplates other semiconductor materials such as, for example, SiGe, SiGeC, SiC, GaAs, InAs, InP, and other III/V or II/VI compound semiconductors. In embodiments, the semiconductor layer 18 can have a thickness of about 5 nm to about 50 nm. A metal or metal alloy layer 20 is deposited on the semiconductor layer 18. In embodiments, the metal or metal alloy layer 20 can be deposited to a thickness of about 2 nm to 20 nm using conventional chemical vapor deposition (CVD) or atomic layer deposition (ALD) processes. The metal or metal alloy layer 20 can comprise as examples, Al, Au or Cu, amongst other metal materials.

The metal or metal alloy layer 20 and semiconductor layer 18 undergo a patterning process to form discrete islands 20a. These discrete islands will be formed into nanowires in subsequent fabrication processes. The patterning process can be performed using conventional lithography and etching processes. For example, a resist can be formed over the metal or metal alloy layer 20 and exposed to energy (e.g., light) to form openings or patterns. A reactive ion etching (RIE) process is then performed through the openings with a chemistry selective to the metal or metal alloy layer 20, followed by a chemistry selective to the semiconductor layer 18. In this way, the patterning process will form islands 20a comprising the semiconductor layer 18 and the metal or metal alloy layer 20. The resist can then be removed using a conventional ashing process.

Figure 2A:
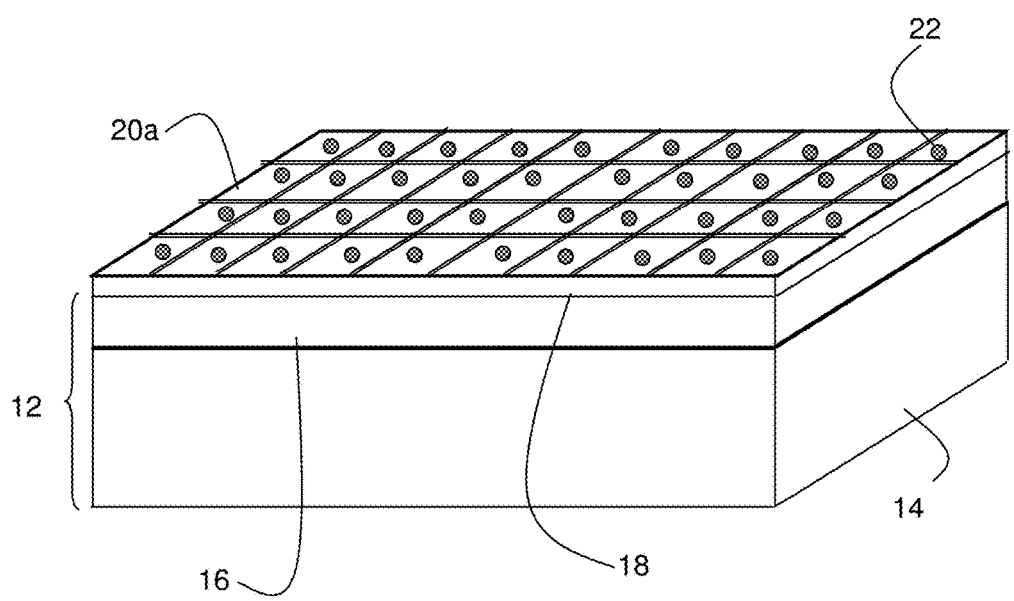
FIG. 2A is a perspective view of the structure of FIG. 1 after undergoing an anneal process in accordance with aspects of the present disclosure.
Figure 2B:
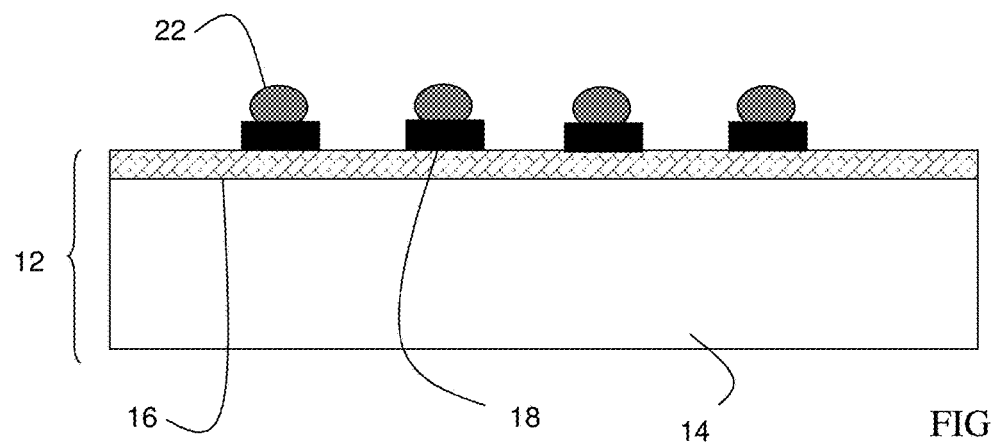
FIG. 2B is a cross sectional view of FIG. 2A.

FIG. 2A is a perspective view of the structure of FIG. 1 after undergoing an anneal process; whereas, FIG. 2B is a cross sectional view of FIG. 2A. In FIGS. 2A and 2B, the metal or metal alloy layer 20 undergoes an anneal treatment to form nanodot seeds 22. In embodiments, the anneal treatment comprises a baking process at a temperature of about 400° C. to about 600° C. for about 2 minutes to about 20 minutes. As one of skill in the art would understand, this anneal process will shrink the metal or metal alloy layer due to surface tension forces, resulting in the nanowire seeds 22.

Figure 3:
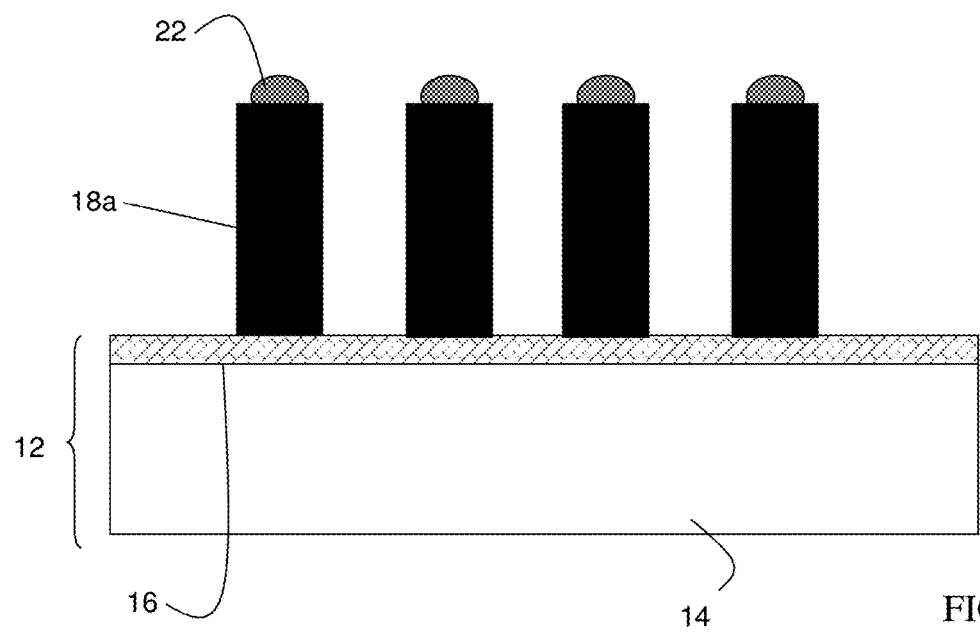
FIG. 3 shows nanowires and respective fabrication processes in accordance with aspects of the present disclosure.

FIG. 3 shows a growth process forming nanowires 18a in accordance with aspects of the present disclosure. For example, in embodiments, the growth process includes placing the structure in a chamber of $SiH_4$ at a temperature of about 300° C. to about 700° C. In embodiments, the nanowires 18a can grow to about 10 microns to 100 microns tall, although other dimensions are also contemplated by the present disclosure. In embodiments, the nanowires 18a can be about 10 to 30 nm in diameter; although other dimensions are also contemplated herein.

Figure 4:
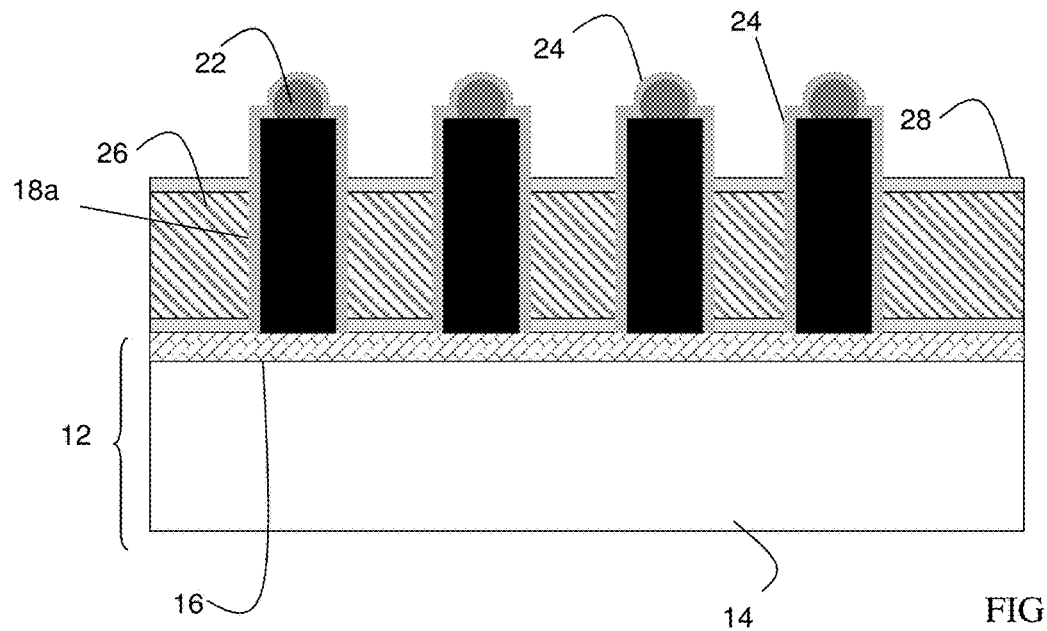
FIG. 4 shows several processing steps and a resultant structure in accordance with aspects of the present disclosure.

FIG. 4 shows several additional processing steps and a resultant structure in accordance with aspects of the present disclosure. In particular, a high-k dielectric layer 24 is deposited on the vertical sidewalls of the nanowires 18a and other exposed surfaces, e.g., on the nanowire seeds 22 and the exposed surfaces of the insulator layer 16. In embodiments, the high-k dielectric layer 24 can be a hafnium based material, e.g., $HfO_2$, deposited to a thickness of about 1 nm to about 5 nm. The high-k dielectric layer 24 can be deposited using conventional ALD processes.

Still referring to FIG. 4, a doped polysilicon material 26 is deposited on the high-k dielectric layer 24, followed by a recess process (e.g., etching process) to expose upper portions of the nanowires 18a and the nanowire seeds 22. In embodiments, the doped polysilicon material 26 can be an N+ doped layer, e.g., arsenic or phosphorous, or a P+ doped layer, e.g., boron, deposited using conventional CVD processes. In embodiments, the doped polysilicon material 26 can be recessed by a conventional wet etching process or dry etching process such as RIE to expose a vertical extent of approximately 20 nm to about 100 nm of the nanowires 18a, below the nanowire seeds 22.

As further shown in FIG. 4, the structure then undergoes a high temperature thermal oxidation process to form a high temperature oxide layer 28 on the doped poly silicon surface. In embodiments, the high temperature oxide layer 28 can be about 3 nm to about 20 nm in thickness; although other dimensions are contemplated by the present disclosure. This layer of oxide functions as an insulator between the vertical nanowire capacitor and vertical nanowire transistor.

Figure 5A:
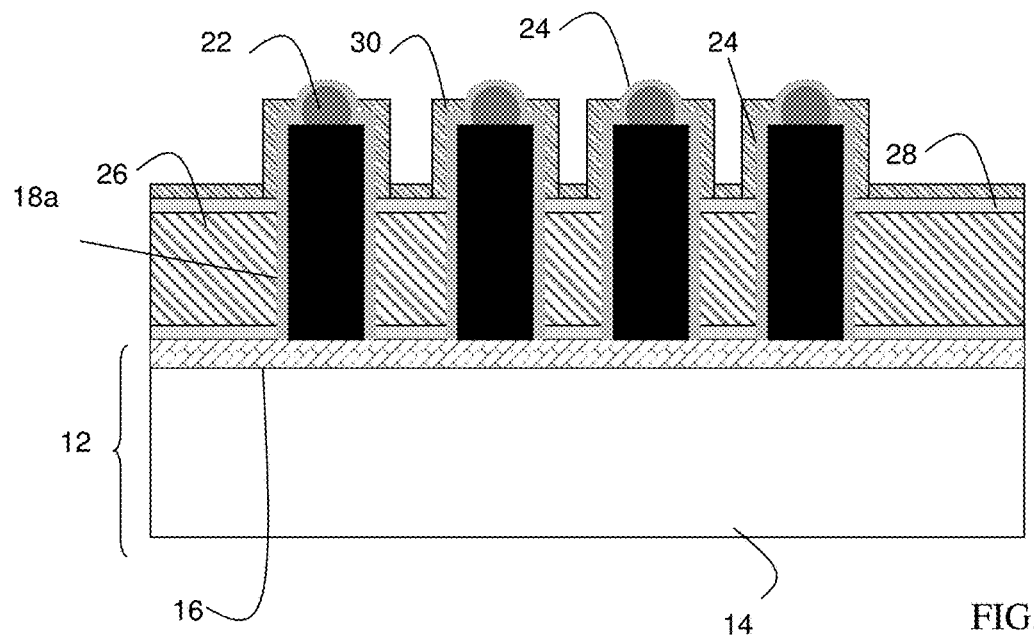
FIG. 5A is a perspective view of the structure of FIG. 4 after undergoing a deposition process of conductive material in accordance with aspects of the present disclosure.
Figure 5B:
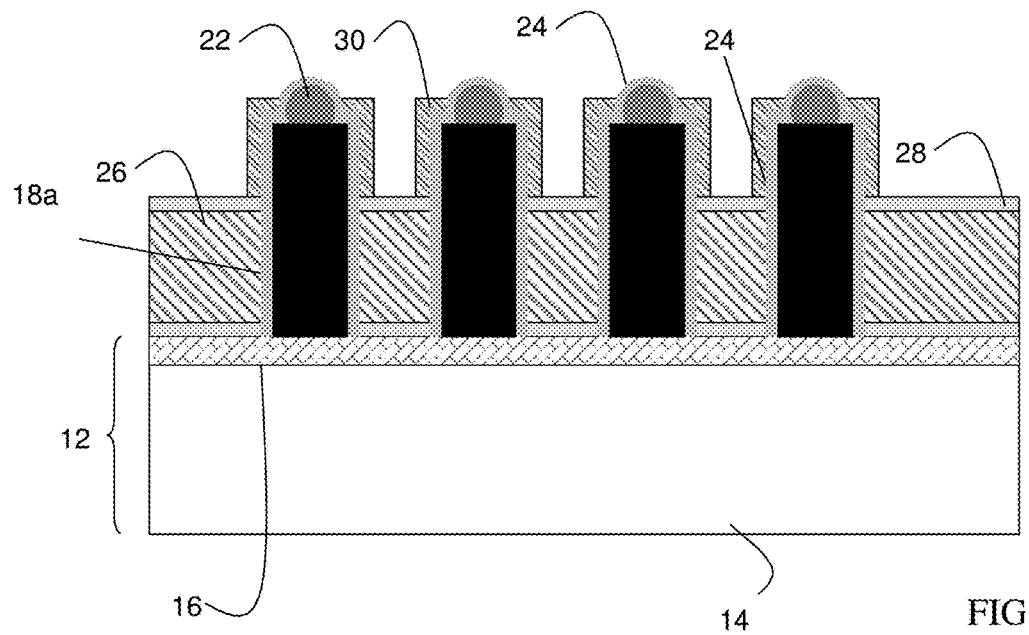
FIG. 5B is a cross sectional view of FIG. 5A.

FIG. 5A is a perspective view of the structure of FIG. 4 after undergoing a conductive deposition process; whereas, FIG. 5B is a cross sectional view of FIG. 5A. In particular, FIGS. 5A and 5B show a metal deposition surrounding the high-k layer and silicon nanowire to form an all-around gate structure for the vertical pass gate transistor. As should be understood by those of skill in the art, the high-k material functions as gate dielectric and the metal layer functions as a control gate. In more specific embodiments, a metal layer 30 is deposited on the exposed surfaces, including the oxide layer 28 and the exposed portions of the nanowires 18a and nanowire seeds 22. The metal layer 30 can be, for example, Al or Cu, deposited to a thickness of about 2 nm to about 20 nm. In embodiments, the metal layer 30 can be deposited using conventional ALD or CVD processes. This layer of oxide functions as an insulator between the vertical nanowire capacitor and vertical nanowire transistor.

As shown particularly in FIG. 5A, the metal layer 30 can undergo a recess process, e.g., etching process, to expose the nanowire seeds 22. In embodiments, the recess process will recess the metal layer 30 to below the nanowire seeds 22, such that the metal layer is electrically separated, e.g., isolated, from the nanowire seeds 22, in this cross sectional orientation. As shown in FIG. 5B, the metal layer 30 are formed over the nanowire seeds 22.

Figure 6:
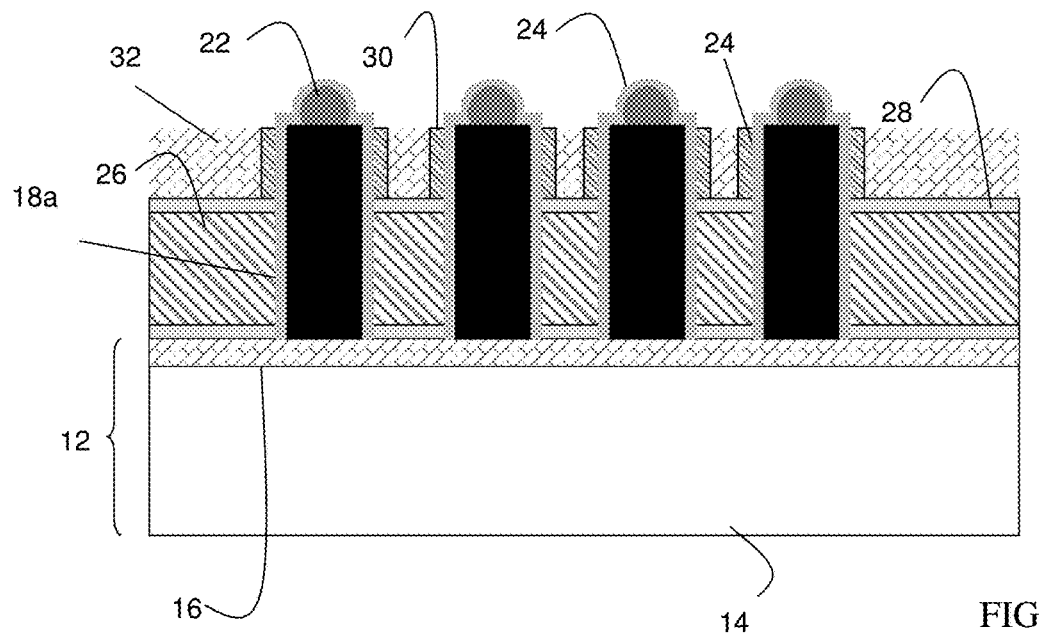
FIG. 6 shows an intermediate structure with an interlevel dielectric material deposited on the exposed surfaces of the structure shown in FIGS. 5A and 5B, in accordance with aspects of the present disclosure.

In FIG. 6, an interlevel dielectric material 32 is deposited on the exposed surfaces of the structure of FIGS. 5A and 5B in accordance with aspects of the present disclosure. The interlevel dielectric material 32 can be $SiO_2$ deposited using conventional deposition processes, e.g., CVD. In embodiments, the interlevel dielectric material 32 can be recessed to below the nanowire seeds 22, and will provide electrical insulation between the metal layers 30 (e.g., wordlines) on the sidewalls of the nanowires 18a. The recess process can also recess the metal layer 30 to below the nanowire seeds 22, thus forming the wordlines of the memory cell. In embodiments, the metal layer 30 is formed on upper vertical surfaces of the nanowires, separated from the metal by the high-k dielectric material 24. The recess process can be a conventional etching process, e.g., RIE, selective to the materials being recessed.

Figure 7:
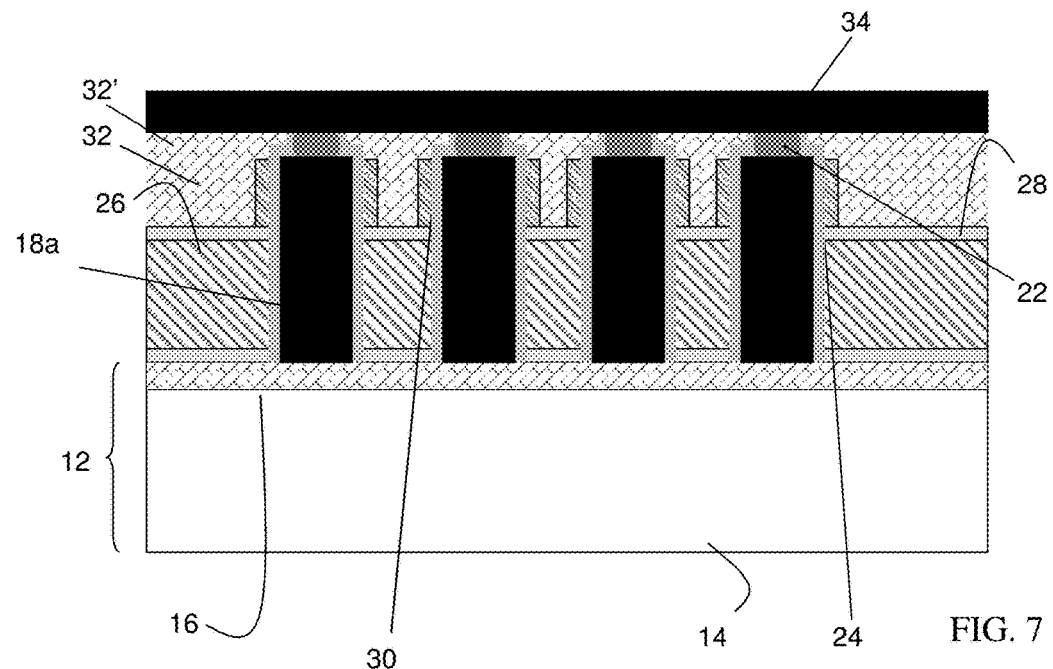
FIG. 7 shows a cross-sectional view of a memory cell array and respective fabrication processes in accordance with aspects of the present disclosure.

In FIG. 7, a second interlevel dielectric material 32' is deposited over the interlevel dielectric material 32, following by a planarization process. In embodiments, the planarization process can be a chemical mechanical polishing (CMP) process, which will also remove portions of the high-dielectric material 24 formed over the nanowire seeds 22. In this way, the nanowire seeds 22 can be exposed.

Still referring to FIG. 7, a metal layer 34 is deposited on the second interlevel dielectric material 32' and in direct electrical contact with the exposed portions of the nanowire seeds 22. The metal layer 34 can be any wiring material such as a copper or tungsten metal wiring, deposited using a conventional CVD process. In embodiments, the metal layer 34 can be used as a bitline in a memory cell. In embodiments, the interlevel dielectric material 32' will provide electrical insulation (e.g., isolation) between the metal layer 34 (e.g., bitline) and the metal layers 30 (e.g., wordlines). Also, as should be recognized by those of skill in the art, the nanowires 18a can be vertical channels and the doped polysilicon material 26 between the nanowires 18a can be a common bottom plate.

Figure 8:
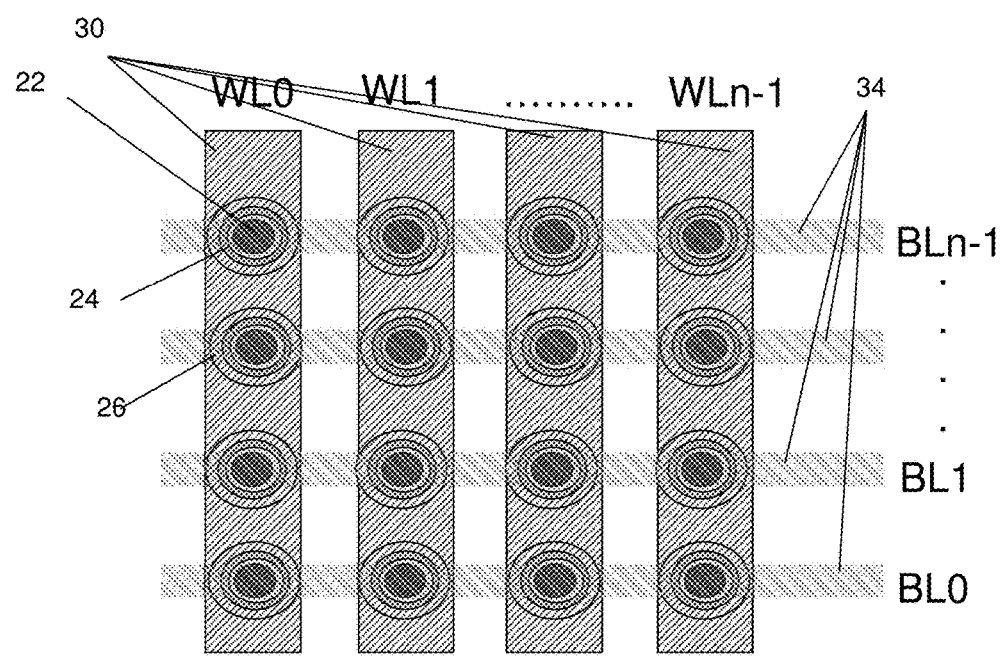
FIG. 8 shows a top view of the memory cell array of FIG. 7.

FIG. 8 shows a top view of the structure shown in FIG. 7. More specifically, FIG. 8 shows the memory cell array layout with the plurality of bitlines and plurality of wordlines formed in accordance with aspects of the present disclosure. As shown in FIG. 8, the bitlines are composed of the metal material 34, and are in contact with the nanowires 18a through the nanowire seeds 22.

FIGS. 9-14 show structures and respective fabrication processes in accordance with additional aspects of the present disclosure. In particular, the structure 10' of FIG. 9 includes a metal layer 36 deposited on the vertical sidewalls of the nanowires 18a, followed by the deposition of the high-k dielectric material 24. In embodiments, the metal layer 36 can be TiN or tungsten, blanket deposited on exposed surfaces of the nanowires 18a and nanowire seeds 22. The metal layer 36 can be deposited by an ALD process or CVD process to a thickness of about 1 nm to about 10 nm; although other dimensions are contemplated by the present disclosure. In embodiments, the high-k dielectric layer 24 can be a hafnium based material, e.g., $HfO_2$, deposited to a thickness of about 1 nm to about 5 nm, over the metal layer 36. The high-k dielectric layer 24 can be deposited using conventional ALD processes.

Figure 9:
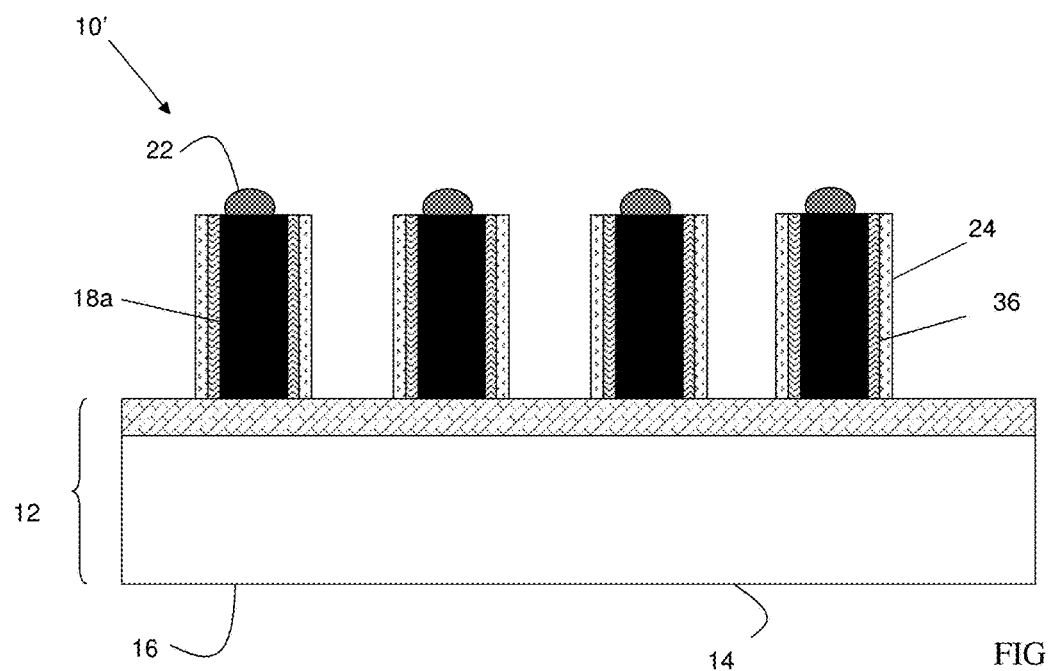
FIGS. 9-14 show structures and respective fabrication processes in accordance with additional aspects of the present disclosure.

Still referring to FIG. 9, the metal layer 36 and the high-k dielectric material 24 will undergo an etching process in order to remove material from the horizontal surfaces of the structure, e.g., the insulator layer 16 and upper portion of the nanowire seeds 22. In this way, the metal layer 36 and the high-k dielectric material 24 will remain on the vertical sidewalls of the nanowires 18a. In embodiments, the etching process can be a conventional anisotropic etching process using chemistries selective to the materials being removed.

Figure 10:
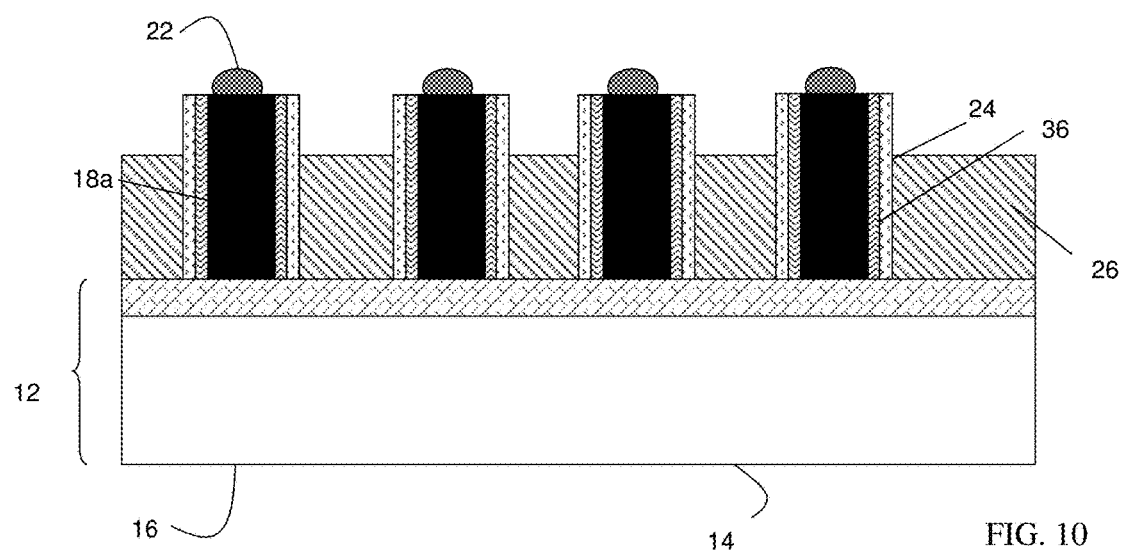

In FIG. 10, a doped polysilicon material 26 is deposited on the high-k dielectric layer 24 and other exposed surfaces of the structure, followed by a recess process (e.g., etching process) to expose upper portions of the nanowires 18a and the nanowire seeds 22. In embodiments, the doped polysilicon material 26 can be an N+ doped layer, e.g., arsenic or phosphorous, or a P+ doped layer, e.g., boron, deposited using conventional CVD processes. In embodiments, the doped polysilicon material 26 can be recessed by a conventional etching process (e.g., RIE) to expose a vertical extent of approximately 20 nm to about 100 nm of the nanowires 18a, below the nanowire seeds 22.

Figure 11:
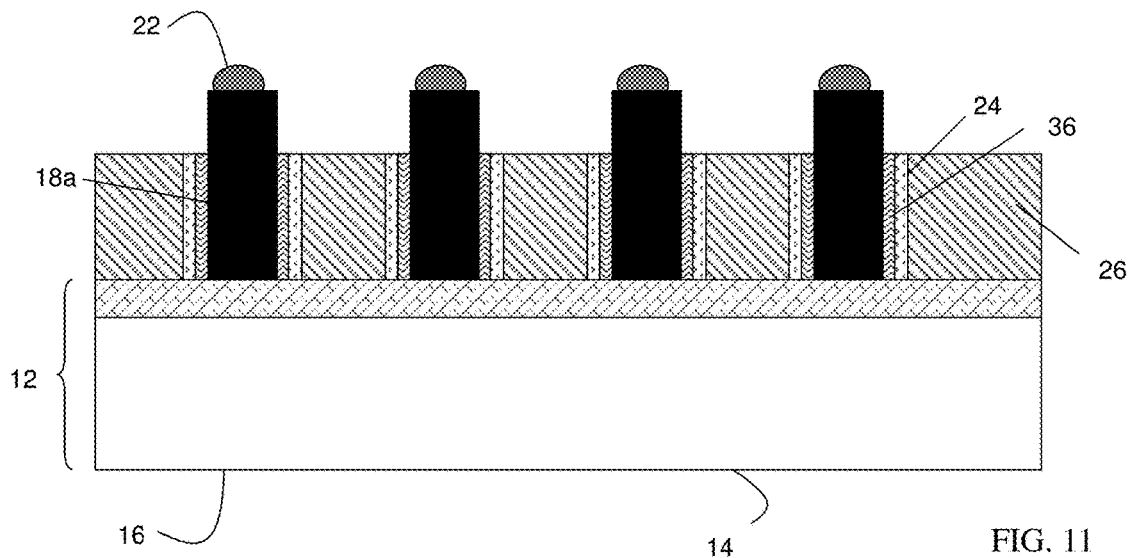
Figure 12:
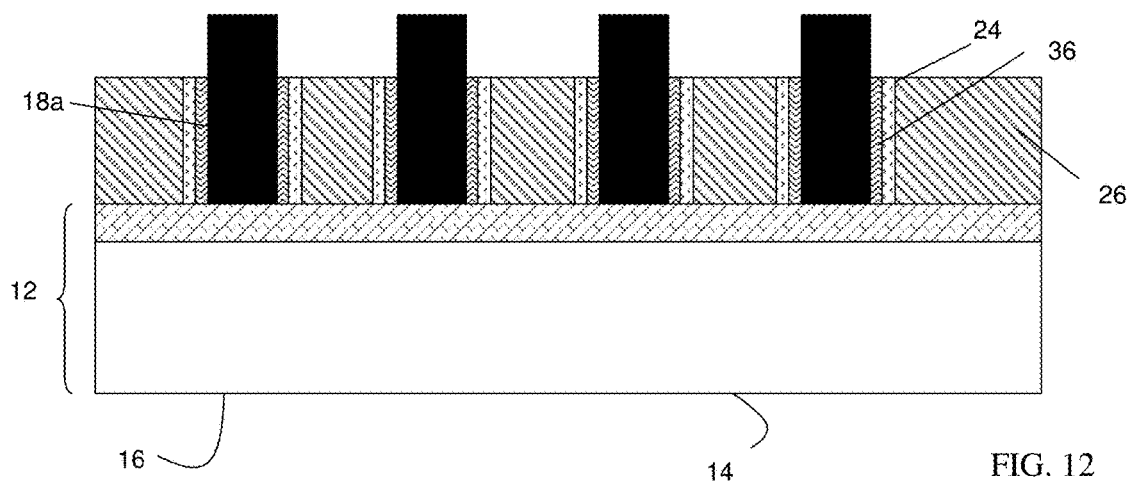

As shown in FIG. 11, the metal layer 36 and the high-k dielectric material 24 are recessed to expose an upper portion of the nanowires 18a. The removal of the metal layer 36 and the high-k dielectric material 24 can be performed by a RIE process with selective chemistries, with the surface of the doped polysilicon material 26 acting as an etch stop layer. In an alternative embodiment, as shown in FIG. 12, the nanowire seeds 22 can also be removed from the upper surface of the nanowire 18a.

Figure 13:
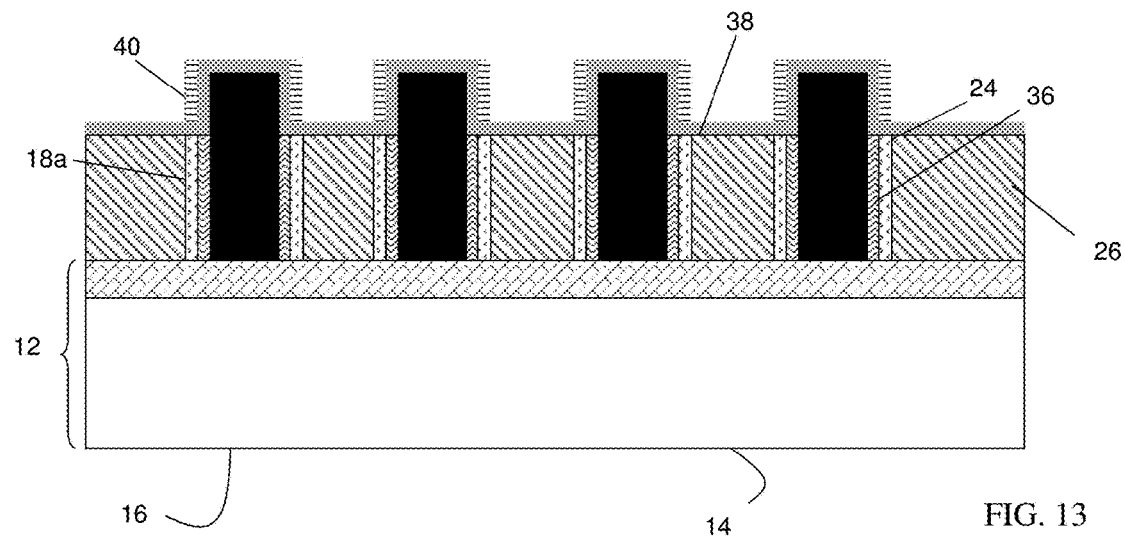

As shown in FIG. 13, a high-k dielectric material 38 is deposited on the exposed portions of the nanowires 18a and the surface of the high-k dielectric layer 24. In embodiments, high-k dielectric material 38 can be blanket deposited by an ALD process or CVD process to a thickness of about 1 nm to about 5 nm; although other dimensions are contemplated by the present invention. In embodiments, the high-k dielectric layer 38 can be a hafnium based material, e.g., $HfO_2$. A metal layer 40 is deposited on the high-k dielectric material 38 using an ALD process or CVD process to a thickness of about 3 nm to about 8 nm; although other dimensions are contemplated by the present invention. In embodiments, the metal layer 40 can undergo an anisotropic etch to remove the metal layer 40 from horizontal surfaces, e.g., on horizontal surfaces of high-k dielectric layer 38 on the nanowires 18a and on the doped polysilicon material 26. In this way, the metal layer 40 will remain on the vertical surfaces of the nanowires 18a. As should be understood by those of skill in the art, the metal layer 40 will form the wordlines on an upper vertical surfaces of the nanowires 18a, separated from the metal by the high-k dielectric material 38.

Figure 14:
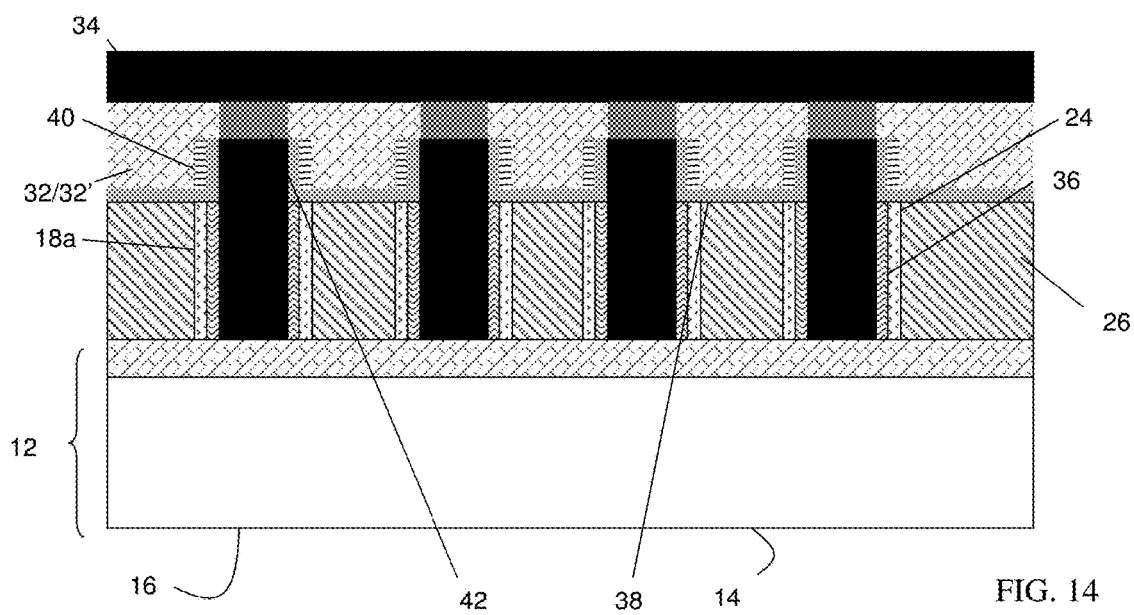

In FIG. 14, interlevel dielectric material 32/32' is formed over the structure by a blanket deposition of insulator material. In embodiments, the interlevel dielectric material 32/32' can be an oxide based material, e.g., $SiO_2$, deposited using a conventional CVD process. The interlevel dielectric material 32/32' will undergo a CMP process, exposing the metal of the nanowires 18a, e.g., removing the high-k dielectric material 24 from a top surface of the nanowires 18a.

The exposed portions of the nanowires 18a then undergo a silicide process to form silicide contacts 42. As should be understood by those of skill in the art, the silicide process begins with deposition of a thin transition metal layer, e.g., nickel, cobalt or titanium, over the nanowires 18a. After deposition of the material, the structure is heated to about 400° C. allowing the transition metal to react with exposed silicon (or other semiconductor material as described herein) forming a low-resistance transition metal silicide. Following the reaction, any remaining transition metal is removed by chemical etching, leaving silicide contacts 42. In alternate embodiments using the structure of FIG. 11, the silicide contacts 42 can be formed directly on the nanowire seeds 22.

As further shown in FIG. 14, a metal layer 34 is deposited on the interlevel dielectric material 32/32' and in direct electrical contact with the exposed portions of the silicide contacts 42. The metal layer 34 can be any wiring material such as a copper or tungsten metal wiring, deposited using a conventional CVD process. In embodiments, the metal layer 34 can be used as a bitline in a memory cell, which is electrically isolated from the metal layer 40 (e.g., wordline) by interlevel dielectric material 32/32'. The interlevel dielectric material 32/32' will also provide electrical insulation (e.g., isolation) between the metal layers 40 (e.g., wordlines). As should be recognized by those of skill in the art, the nanowires 18a can be vertical channels and the doped polysilicon material 26 between the nanowires 18a can be a common bottom plate.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A vertical memory cell array, comprising:
   a plurality of vertical nanowires extending from an insulator layer;
   a dielectric material on vertical sidewalls of the plurality of vertical nanowires;
   doped material provided between the plurality of vertical nanowires;
   at least one bitline extending on a top of the plurality of vertical nanowires and in electrical contact therewith;
   at least one wordline formed on the vertical sidewalls of the plurality of vertical nanowires and separated therefrom by the dielectric material;
   a silicide on a top of each of the nanowires and in electrical contact with the at least one bitline; and
   a metal layer on the vertical sidewalls of the plurality of vertical nanowires, separating a second dielectric material from contacting the vertical sidewalls of the plurality of vertical nanowires.

2. The vertical memory cell array of claim 1, wherein the metal layer and the second dielectric material are vertically recessed to below a top surface of the plurality of vertical nanowires such that they are electrically isolated from the silicide.

3. The vertical memory cell array of claim 2, wherein the dielectric material further comprises a high-k dielectric material formed on exposed portions of the plurality of vertical nanowires and the at least one wordline is formed on the high-k dielectric material.

4. A vertical memory cell, comprising:
   a plurality of vertical nanowires;
   a high-k dielectric material on vertical sidewalls of the plurality of vertical nanowires;
   doped polysilicon material provided between the plurality of vertical nanowires;
   at least one metal formed on vertical sidewalls of the plurality of vertical nanowires over the high-k dielectric material and electrically isolated from the doped polysilicon material;
   at least one metal extending on a top of the plurality of vertical nanowires, in electrical contact with the plurality of vertical nanowires and electrically isolated from the doped polysilicon material;
   a silicide on a top of each of the nanowires and in electrical contact with the at least one metal extending on the top of the plurality of vertical nanowires; and
   a metal layer on the vertical sidewalls of the plurality of vertical nanowires, separating the high-k dielectric material from contacting the vertical sidewalls of the plurality of vertical nanowires, wherein the metal layer and the high-k dielectric material are vertically recessed to below a top surface of the plurality of vertical nanowires such that they are electrically isolated from the silicide.

5. The vertical memory cell of claim 4, further comprising a second high-k dielectric material formed on exposed portions of the plurality of vertical nanowires.

* * * * *